United States Patent [19]

Brandestini

[11] Patent Number: 5,519,393
[45] Date of Patent: May 21, 1996

[54] ABSOLUTE DIGITAL POSITION ENCODER WITH MULTIPLE SENSORS PER TRACK

[75] Inventor: Marco Brandestini, Montagnola, Switzerland

[73] Assignee: Bouens, Inc., Riverside, Calif.

[21] Appl. No.: 201,739

[22] Filed: Feb. 25, 1994

Related U.S. Application Data

[63] Continuation-in-part of Ser. No. 96,047, Jul. 22, 1993, abandoned.

[51] Int. Cl.⁶ .................................................. H03M 1/22
[52] U.S. Cl. .................................................. 341/10; 341/11
[58] Field of Search .................................. 341/6, 7, 8, 9, 341/10, 11

[56] References Cited

U.S. PATENT DOCUMENTS

| | | | |
|---|---|---|---|
| 3,835,377 | 9/1974 | Kataoka | 341/15 |
| 4,947,166 | 8/1990 | Wingate et al. | 341/13 |
| 5,029,304 | 7/1991 | Tolmie, Jr. | 341/15 |

FOREIGN PATENT DOCUMENTS

| | | |
|---|---|---|
| 0332244 | 9/1989 | European Pat. Off. . |
| 2226720 | 7/1990 | United Kingdom . |

OTHER PUBLICATIONS

Doebelin, Ernest; "Measurement Systems"; McGraw–Hill Book Company, New York; 1983; pp. 294–299.
Heidenhein Marketing Brochure (excerpt showing Model ROC 411); and attached English translation.
Vogt Advertisement; and English translation of Text.
Ebe Product Announcement; and English translation of text.
Bourns Data Sheet for Digital Contacting Encoders.
EECO Catalog p. 545 showing PCB switches.
Hewlett Packard Catalog pp. 4–and 4–5 showing motion sensing and control devices.
Patent Abstracts of Japan; vol. 10, No. 327; Nov. 7, 1986 JP–61–133 819 (1 page).
IEEE Transations on Instrumentation and Measurement vol. 39, No. 5; Oct. 1990 (5 pages).
Gilbert, E. N. "Gray Codes and Paths on the n–Cube", Bell Systems Tehnical Journal, May, 1958, pp. 815–826.
Ruskey, Frank et al. "Generating Necklaces", J. of Algorithms 13, 1992, pp. 414–430.
Stewart, Ian; "Game, Set & Math", Oxford Press, Cambridge, Massachusetts; 1989; pp. 42–54.

*Primary Examiner*—Howard L. Williams
*Attorney, Agent, or Firm*—Knobbe, Martens, Olson & Bear

[57] ABSTRACT

A method and apparatus to convert absolute angular or linear position to digital information utilizes a ternary coding scheme. The code is arranged along a single track. Sensors placed at essentially equal intervals distinguish three states per position. The sensor outputs are converted from ternary to binary data by combinatorial logic. The sensors may be mechanical contacts, optical detectors, magnetic detectors, or capacitive detectors. Such an encoder may be used as a potentiometer, multiposition switch replacement, shaft encoder, or length measurement device.

47 Claims, 11 Drawing Sheets

```
0 0 1 1 1 0 0 1 1 1 1 1 0 0 2 2 2 0 0 2 2 2 2 2
1 1 1 1 0 0 2 2 2 0 0 2 2 2 2 2 0 0 1 1 1 0 0 1
2 0 0 2 2 2 2 0 0 1 1 1 0 0 1 1 1 1 0 0 2 2
```

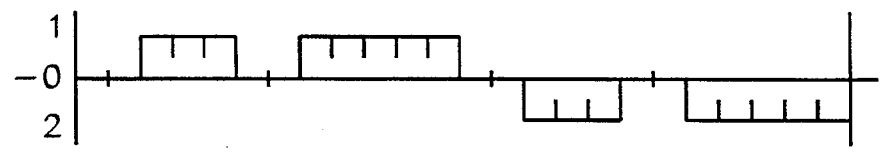
FIG. 2c
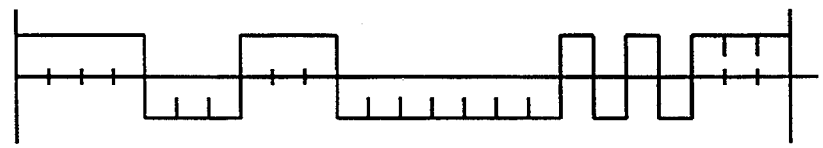
FIG. 2d
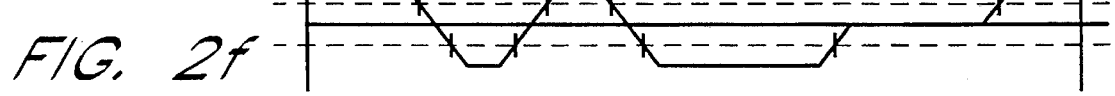
FIG. 2e
FIG. 2f
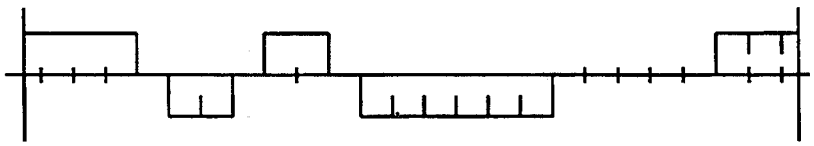
FIG. 2g 5,519,393

ABSOLUTE DIGITAL POSITION ENCODER WITH MULTIPLE SENSORS PER TRACK

This application is a continuation in part of U.S. Ser. No. 08/096 047 filed Jul. 22, 1993, now abandoned.

FIELD OF THE INVENTION

This invention relates to the task of converting angular or linear mechanical position to a digital output and, more particularly, to an absolute digital position encoder having multiple sensors positioned along a single track.

BACKGROUND OF THE INVENTION

Presently, a number of schemes exist to convert angular or linear mechanical position to a digital output. The most simple converters are potentiometers, which convert position to an output voltage by acting as a resistive divider. Their analog output can then be converted to a digital format, if required. In a case calling for an output signal that consists of discrete steps, a multiposition switch is the present choice.

With the advance of microprocessor-based equipment, digital incremental encoders have emerged. They typically employ a single track and two sensors arranged to produce a pair of square wave patterns with a 90° phase shift. An up/down counter is connected to the sensor outputs to deliver position information. If a second track bearing an index marker is provided, the counter can be reset when the index position is sensed. Thus a quasi-absolute scheme results, in that accurate position information can be provided so long as power remains on, but after a power-up condition the position information is not accurate until a relative position is reached in which the index marker resets the counter.

Where true absolute information is required, for example where accurate position information is needed following a power-on condition without relative movement of the encoder parts, multitrack encoders are the most common choice. They typically feature a number of tracks equivalent to the $^2$log of the number of steps to be resolved, for example 8 tracks for a 256 step encoder. The aforementioned encoders most commonly utilize an optical scheme with a photographically fabricated coding wheel bearing a Gray code and LED/phototransistor combinations as detectors.

Other principles worth mentioning are inductive or capacitive resolvers. Both schemes are by nature analog; their two or three phase outputs can be digitized and the rotary angle computed from the respective signal amplitudes. Synchro resolvers are a good example of a three-phase inductive rotary encoder. An application for a linear encoder is found in digital calipers.

One object of the invention is to provide an encoding principle which can yield a digitized absolute angular or linear position.

SUMMARY OF THE INVENTION

The objects and purposes of the invention, including those set forth above, are met according to one form of the present invention by providing a method of generating a numerical value representing an absolute position of a first member with respect to a second member where the first and second members are supported for relative movement, including the steps of: providing on the first member an elongate track having a code extending therealong; sensing the code at a plurality of locations on the second member which are adjacent the track at spaced locations therealong, the track moving past each location during relative movement of the first and second members; generating a set of digital values which each represent a currently-sensed code value at a respective one of the locations; and converting the set of digital values representing currently sensed code values into a final binary output representative of an absolute position of the first member with respect to the second member.

Another form of the present invention involves the provision of an apparatus which includes: a first member having thereon an elongate track with a code extending therealong; a second member supported for movement relative to the first member and having thereon a plurality of sensors which are each adjacent the track at spaced locations therealong, the sensors each moving along the track in response to relative movement of the first and second members; and an electronic circuit which includes a first arrangement responsive to the sensors for generating a set of digital values each representing a currently-sensed code value from a respective sensor, and a second arrangement for converting the set of digital values representing currently-sensed code values into a final binary output representative of an absolute position of the first member with respect to the second member.

One principal feature of the invention involves providing a direct accurate digital output. Another unique feature is the ability to encode the information on a single track, thus reducing the size of an embodiment utilizing the inventive approach. A physical implementation of the present invention, as a general purpose input device, is seen as a replacement for potentiometers in consumer electronic devices (for example to control volume, tone, station select, balance, etc). Another set of applications is in position to digital output conversion, such as is utilized in shaft or linear encoders. In accordance with the inventive principle, these devices yield absolute digital information at low cost and low power consumption. The physical embodiment of the invention can have sensors which sense with mechanical contacts, optical techniques, magnetic techniques or capacitive techniques.

BRIEF DESCRIPTION OF THE DRAWINGS

Several preferred embodiments of the invention are described in detail hereinafter with reference to the accompanying drawings, in which:

FIG. 2a is a state diagram explaining the operation of a 24-step encoder;

FIG. 2b lists a code sequence of 24 unique states corresponding to the state diagram of FIG. 2a;

FIG. 2c is a timing diagram showing amplitude vs. time for one digit of the code sequence of FIG. 2b;

FIG. 2d is a timing diagram showing amplitude vs. time for one digit of another 24 step code sequence according to the invention, which features balanced odd/even transitions;

FIG. 2e is a diagrammatic representation of the aperture of a sliding sensor;

FIG. 2f is a timing diagram showing the result of convolving the digit code sequence of FIG. 2d with the moving sensor aperture of FIG. 2e;

FIG. 2g is a timing diagram showing the final 24 step code for the digit after tri-level discrimination;

DESCRIPTION OF THE PREFERRED EMBODIMENT

Figure 1:
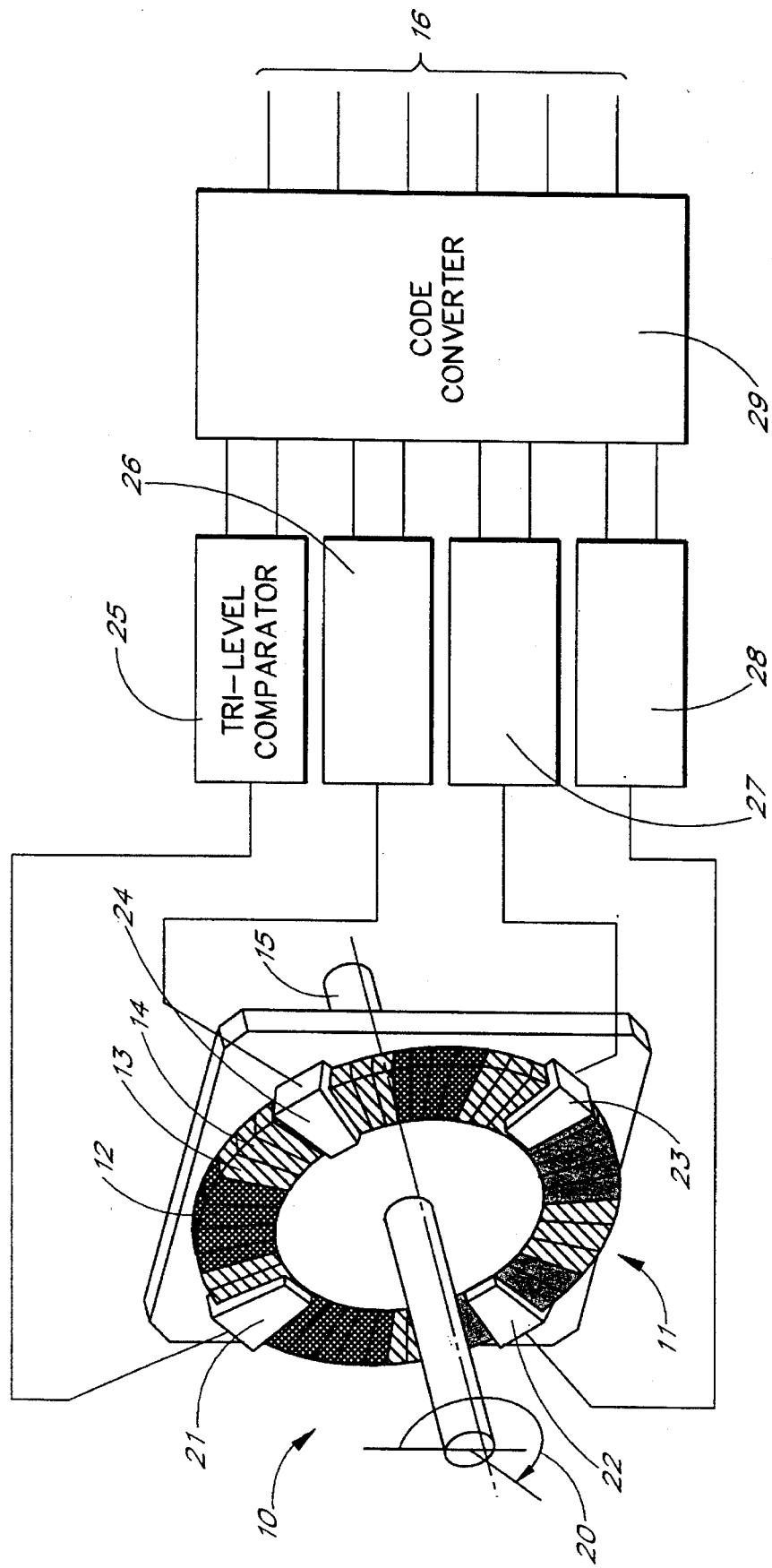
FIG. 1 is a diagrammatic perspective view of an absolute 48-step position encoder embodying the present invention, and shows various functional blocks of the system.

An absolute digital position encoder embodying the invention is shown in FIG. 1. A disc 10 features a circular track 11 which has been subdivided into several sectors 12, 13, 14, and the disk 10 is mounted on a rotatably supported shaft 15. The angular position 20 of the disc is the physical input variable to be converted to an electronic digital output 16. Four stationary sensors 21 to 24 are placed at equal angular intervals to detect a code pattern on the annular track 11. The signals output by the sensors 21 to 24 are fed to a bank of comparators 25 to 28, which in turn feed a code converter 29. The final output 16 of the code converter is an absolute binary code corresponding to the angular position 20 of the disc 10 in a discrete proportional fashion.

To understand the operation of the encoder, we need to look at the underlying coding principle. Conventional encoders utilize a binary scheme, which allows a maximum of $2^n$ combinations, where n is the number of sensors. Unfortunately, in a binary encoder a large number of sensors also means a large number of tracks.

According to the invention, a scheme employing a ternary code first of all yields a larger number of unique combinations, namely $3^n$. A more interesting feature of the ternary code is the fact that cyclic codes are possible which create a unique set of combinations of words of length n, by using n sensors to sense the ternary values at n equal intervals along a track. This feature is the basis for a single track encoder scheme according to the invention.

Even though a ternary code has advantages, in some cases it is more efficient to utilize a binary or a quaternary (two binary bits) coding scheme. This occurs whenever one wants to make use of existing integrated circuitry or when the number of positions per full circle is by nature a power of two (for example a 256 position encoder).

Let us now look closer at the concept of a ternary sequence by first establishing a set of three rules:

1) A ternary digit can assume three states: 0, 1 and 2, where 0 is between 1 and 2.
2) Each ternary code word (n digits) must be unique in a code sequence (no repeats) and adjacent code words in the sequence must differ in exactly one digit.
3) Transitions can only occur between 1 and 0 or between 2 and 0. Direct transitions between 1 and 2 are illegal, because 0 is between 1 and 2 (Rule 1) and thus, in practice, such a transition would inevitably still go through 0, and therefore produce an undesirable glitch.

Figures 2A, 2B:
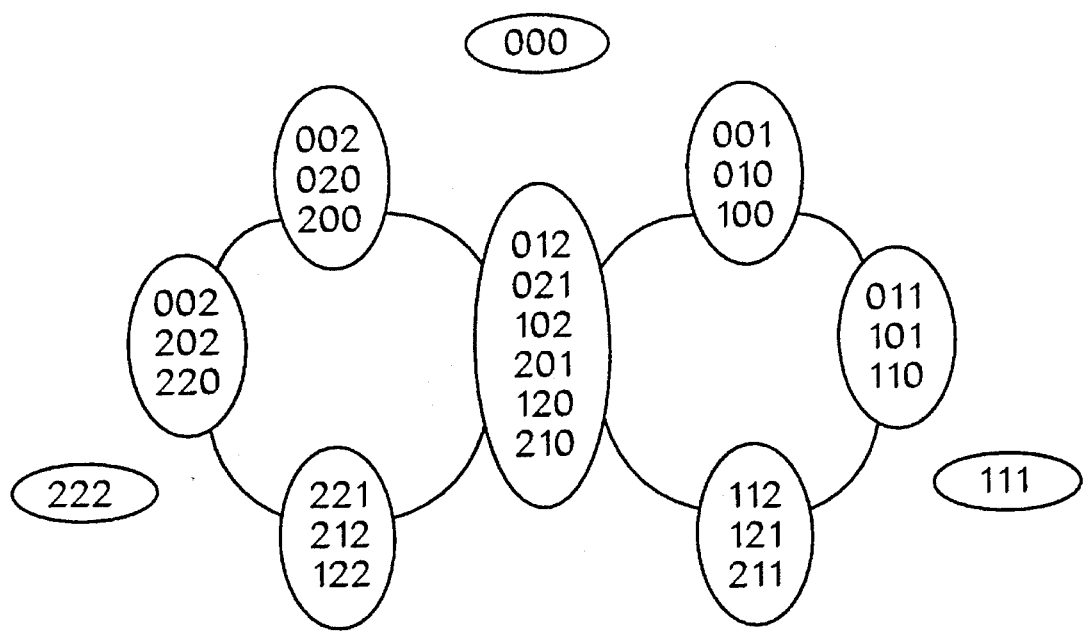
Figure 5:
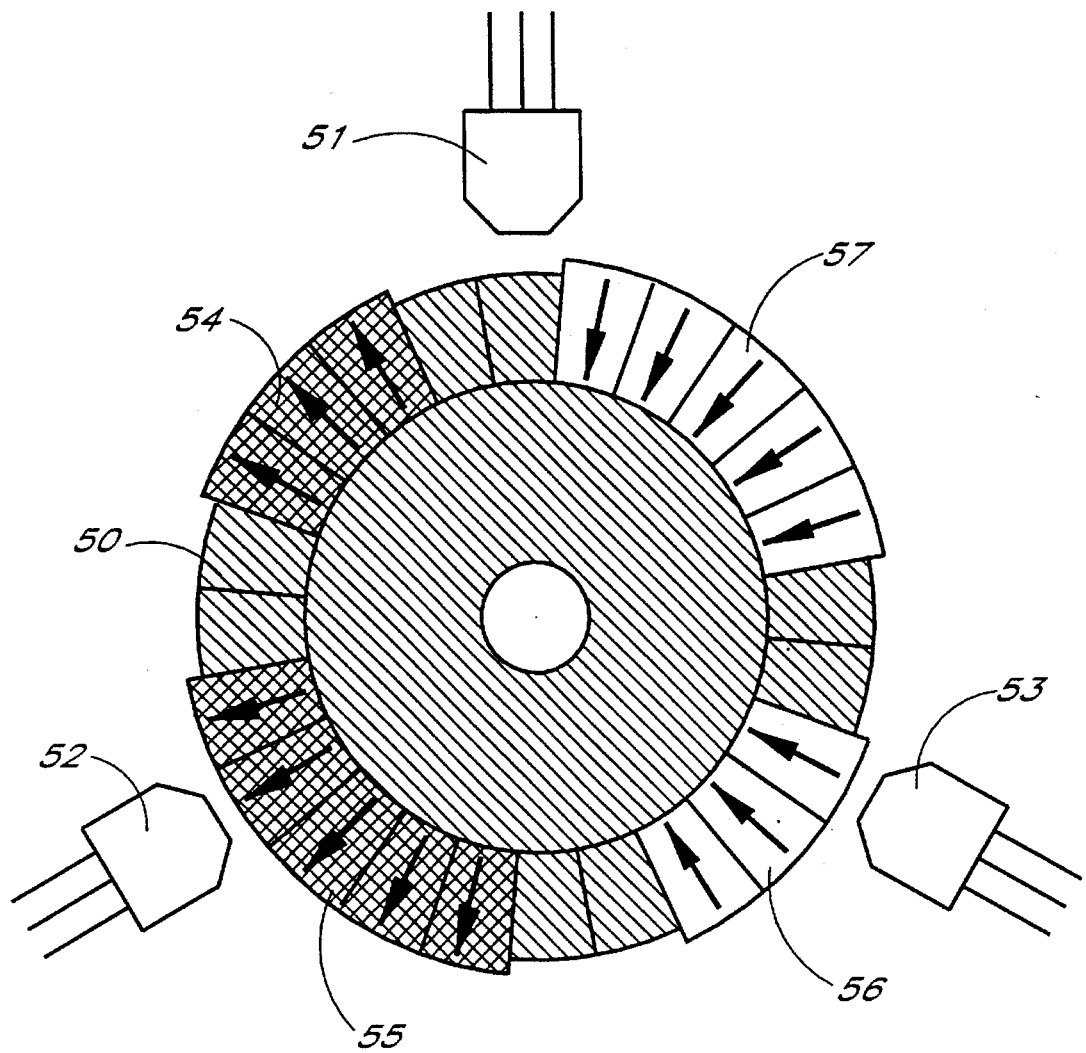
FIG. 5 is a diagrammatic illustration of a further encoder embodying the present invention, which is a low resolution encoder based on a magnetic principle utilizing a selectively magnetized rotor plus three Hall sensors as detectors.

A lattice chart shown in FIG. 2a is useful to illustrate the different possible states and to find a connecting path of the desired length. For simplicity we look at a code with just three ternary digits, resulting in 27 possible states. The chart groups triplets according to their number of zeroes, ones and twos. A number of interesting observations can be made:

1) The states with three identical digits are forbidden codes, since they would repeat themselves three times where the sensors are equally spaced.
2) According to above Rule 3, the path connecting the various triplets can never move horizontally. Instead, the legal moves are always diagonal by either exchanging a 1 or a 2 for a 0, or vice versa.
3) A unique sequence of 24 steps is possible according to this state diagram. The triplets of this sequence are listed explicitly in FIG. 2b. This code is utilized in the magnetic implementation of the encoder which is illustrated in FIG. 5 and described in more detail below. Note that adjacent code words in the output sequence of FIG. 2b differ in exactly one digit.
4) The second and third rows of FIG. 2b are cyclic shifts of the first row. Each shift is one third of the full code length, and reflects the fact that the sensors are equally spaced along the track.

FIG. 2c illustrates the output of one sensor over a period of a 360° rotation of the associated disk. This pattern is obtained when executing three passes along a "figure eight" shaped path in FIG. 2a. The pattern is the same as the first row of FIG. 2b, 1 indicating a positive signal, 2 a negative one. In this code, the second half is the complement of the first half, wherein each half is formed by 12 consecutive code elements. This characteristic of the code can also be seen by observation of FIG. 5, which illustrates the ternary code as applied to a magnetic disk.

Since any practical sensor has a finite size or aperture, the code pattern will necessarily be convolved with the sensor aperture. This results in smoother transitions, limiting the accuracy of the method. If an improved code is used, this effect can be drastically reduced. Such a code is shown in FIG. 2d. Note that the pattern on the code wheel now consists of only two states. FIG. 2f shows the signal obtained when the code pattern is sampled with a detector which has a two step wide aperture as shown in FIG. 2e. Now we can again distinguish three levels and detect 24 unique positions, as shown in FIG. 2g.

An important feature of the inventive single track encoder principle is the newly gained ability to make a low cost encoder module of small size.

Since the inventive encoder yields an absolute reading, it is possible to run it in a strobed fashion without loss of data. A state-of-the-art incremental encoder, on the other hand, must have its sensors active continuously. Where power consumption is a critical issue, strobed operation can reduce the average current to only a few microamperes, even when LEDs or Hall sensors are used, because they can run at a duty cycle of less than 1:1000.

In order to illustrate some different applications, several embodiments of the inventive principle are described below.

Figure 3:
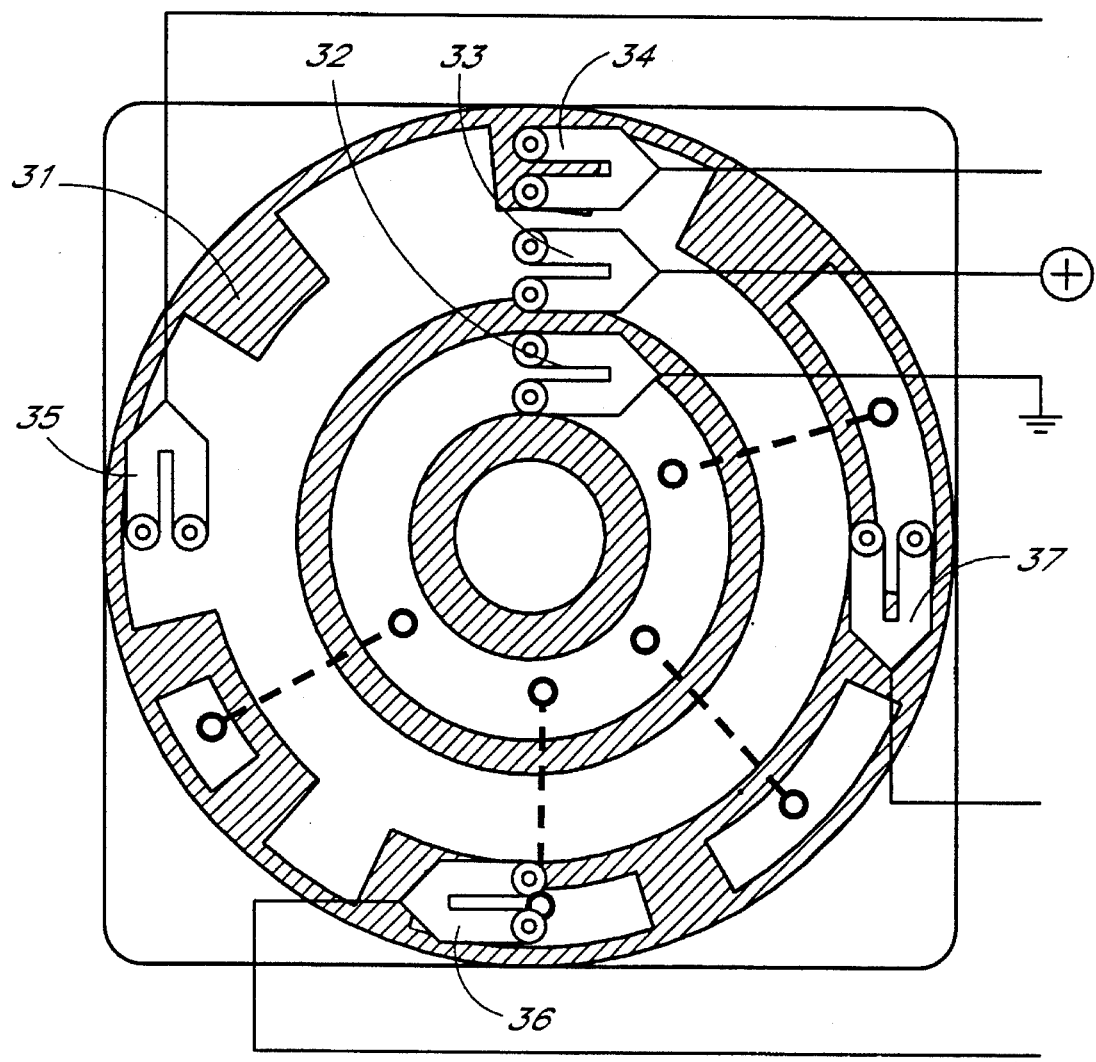
FIG. 3 is a diagrammatic view of another encoder according to the invention, which utilizes a set of sliding contacts.

In a 64 position setup using mechanical contacts, which is shown in FIG. 3, the encoder has a set of sliding contacts 34, 35, 36 and 37 distributed along a single track 31. The different portions of the track 31 are either grounded via a sliding contact 32, connected to the supply voltage via a sliding contact 33, or left open.

Figure 4:
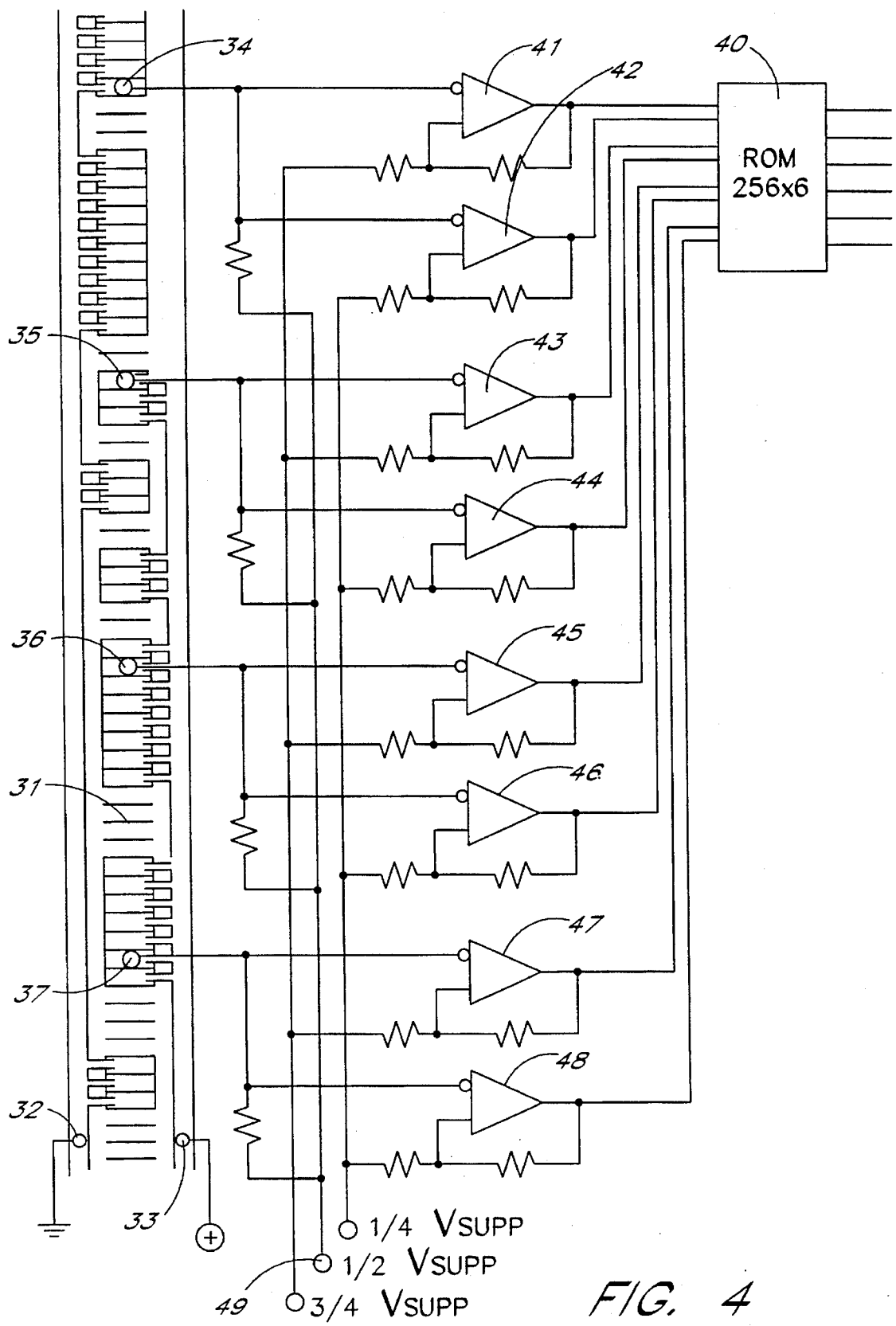
FIG. 4 is a diagrammatic illustration of an electronic comparator and code converter circuitry utilized to generate absolute binary output data from a sliding contact encoder of FIG. 3.

On the sensing side (FIG. 4) we find a bank of comparators 41 to 48. Note that each of the four input lines from the respective sliding contacts 34–37 is resistively tied to a mid-point bias (½ VSUPPLY) 49, so that an open input appears at half the supply voltage. Each channel is equipped with a pair of comparators defining three bands: (1) below one quarter of the supply voltage, (2) one quarter to three quarters of the supply voltage, and (3) above three quarters of the supply voltage, which respectively correspond to the ternary states 2, 0 and 1. A ROM table 40 (256×6), or an equivalent network of AND and OR gates, is then used to convert from the four pairs of lines representing a ternary code word to a conventional binary output format. In the case of the ROM table 40, each address corresponds to a respective ternary code word of the code sequence, and the data in that location is a corresponding binary output value, successive code words of the sequence producing progressively increasing binary values.

MAGNETIC

A first type of non-contacting scheme (FIG. 5) utilizes a magnetized disc 50 and a set of linear Hall sensors 51, 52 and 53 (part #3503 from Allegro Microsystems of Worcester, Mass.). The disk features 24 segments of positive 54 and 55, zero, and negative 56 and 57 flux regions, arranged according to the pattern shown in FIGS. 2 and 5. The zeroes are each two steps wide, and the segments of positive and negative flux are each three or five steps wide.

On the stator part of the encoder, the three Hall sensors 51, 52 and 53 have been mounted in a way to ensure a minimal air gap between each sensor and the magnetic disc 50. A fourth identical sensor (not illustrated) is located outside the magnetic field, and is used as a reference element to compensate for the inherent temperature drift of the sensors. The linear Hall sensors produce a direction sensitive, flux proportional output. The difference between each sensor output signal and the reference element output signal is amplified, producing three channels. These three channels then become inputs to three pairs of comparators, arranged similar to the comparators shown in the circuit of FIG. 4. The ternary output signals of each of the three differential comparators are also similar to the ones found in FIG. 4, as is the table that converts from the comparator states to the final binary position output. As indicated above, the output code sequence for the encoder of FIG. 5 is illustrated in FIG. 2b, and the corresponding output of a single sensor 51, 52 or 53 (during a 360 degree rotation of the disk 50) is illustrated in FIG. 2c.

OPTICAL

Figure 6:
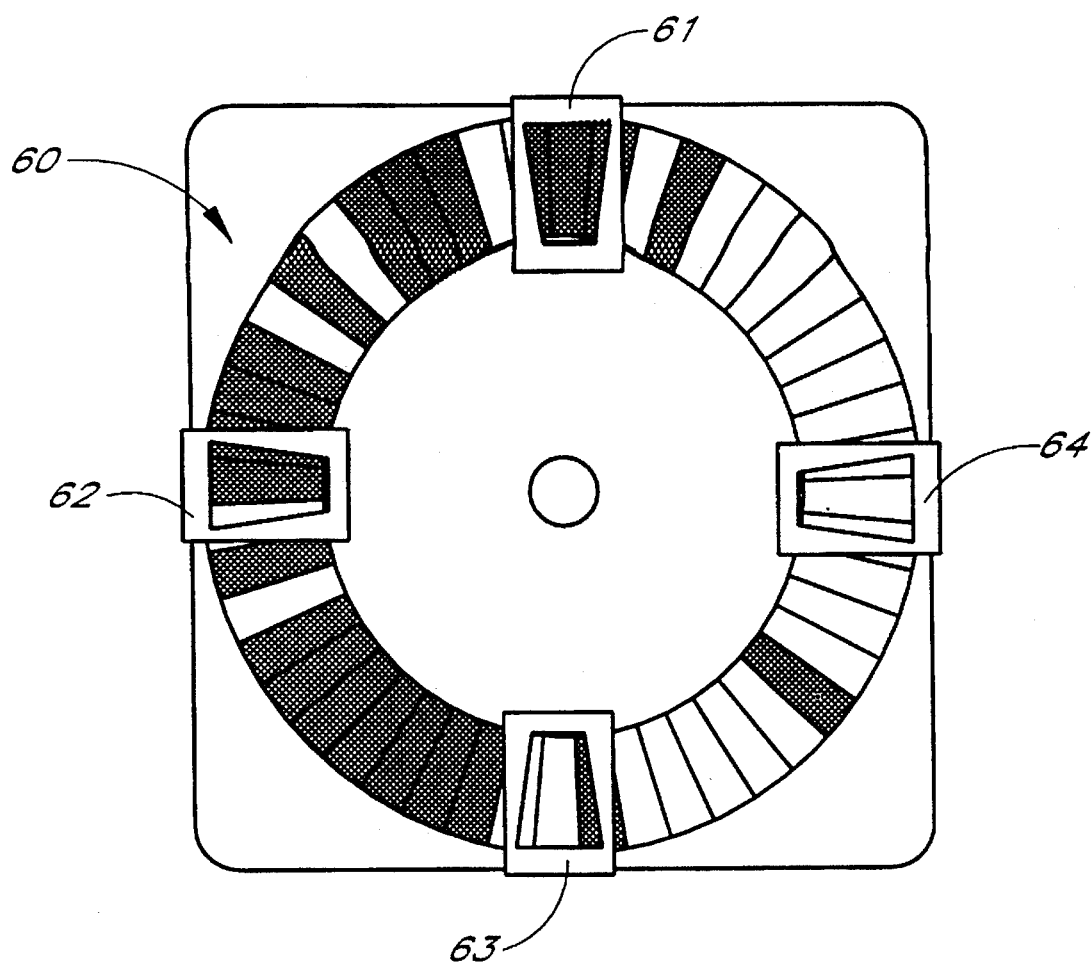
FIG. 6 is an illustration of another encoder embodying the invention, which is based on an optical principle utilizing LED/photo-transistor pairs as detectors and a patterned interrupter wheel as a rotor.

Another non-contacting embodiment involves an optical encoder. Either transmissive or reflective arrangements are possible. FIG. 6 illustrates a 48 increment transmissive set-up. The single track disc 60 is segmented into areas that are transparent or opaque to the near-infrared light used by the photo interrupters. The sensing area of each detector 61 to 64 is a segment two steps wide. Therefore the presence of an opaque and a transparent field within the sensitive area yields the third, semi-opaque state. The utilized code must be of the balanced kind, such as illustrated in FIG. 2d. The detection scheme again is based on two interval comparators per channel, similar to those used in the aforementioned arrangement of FIG. 4.

In yet another optical embodiment, the code pattern could be printed on the edge of paper to be used in a printer, similar to a long bar code arrangement. Reflective sensors can then be used to sense the exact feed amount and line location of the paper.

CAPACITIVE

If a cost effective and low-power encoder is desired, a capacitive scheme has some very attractive features. Its sensors are the plates of a capacitor. In the simplest embodiment, such a set of plates can be formed as lands on two pieces of printed circuit board placed in close proximity to each other. An AC signal applied to one of the plates is capacitively coupled to the opposing plate. The signal needs to be amplified by a device with a very high input impedance, typically an operational amplifier with an FET input. The amplitude of the signal is a function of the amount of overlap between the two plates. For a ternary encoder three states are distinguishable:

a) a signal which is above a threshold (for example 50% of the amplitude at maximum coupling) and which exhibits the same phase as the reference oscillator is treated as a ternary 1.

b) a signal which is above the threshold and 180° out of phase with regard to the reference oscillator is treated as a ternary 2.

c) a signal below the 50% threshold is treated as a ternary 0.

Figure 7:
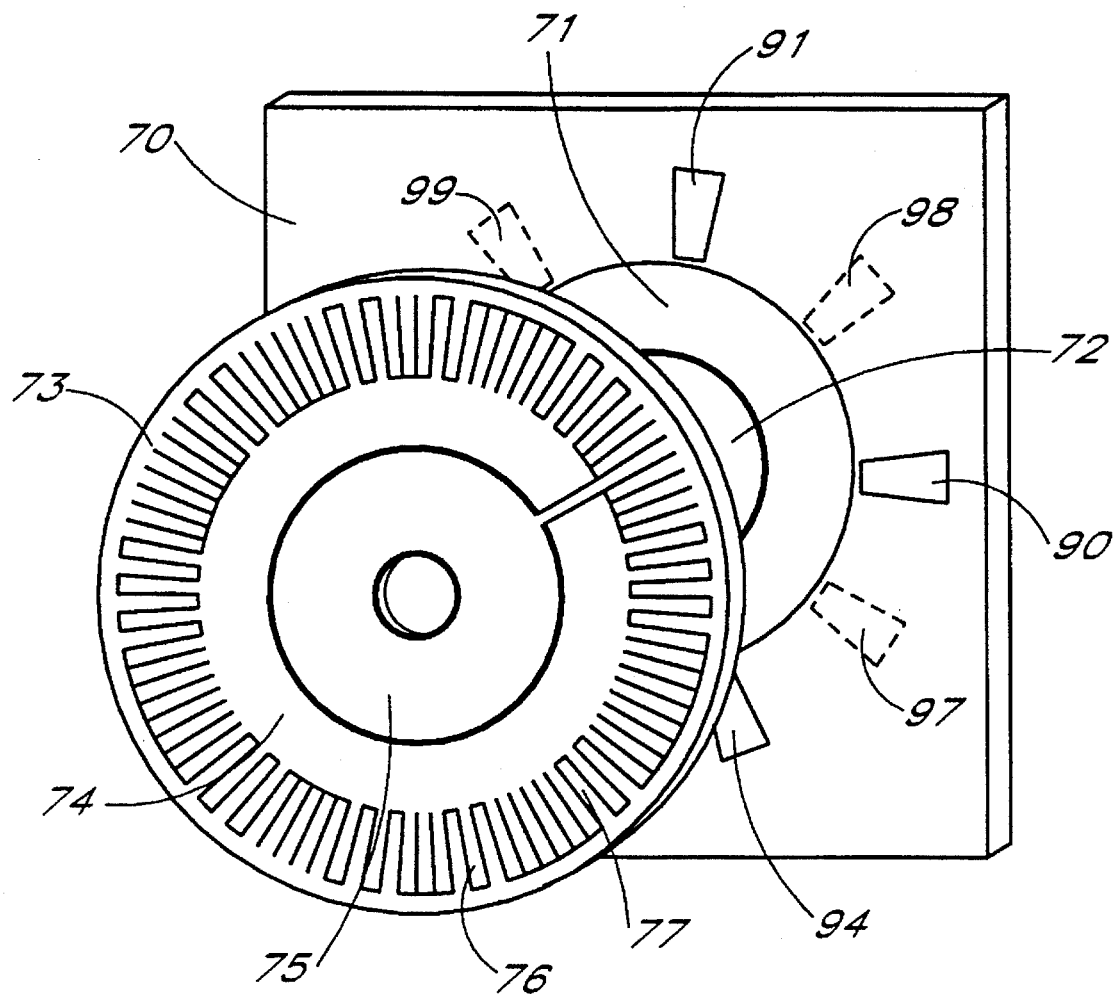
FIG. 7 is a diagrammatic view of still another encoder embodying the invention, which is based on a capacitive principle utilizing sector shaped electrodes as sensors and AC excitation.

FIG. 7 illustrates the arrangement of a 100 increment capacitive encoder. A single sided arrangement is shown, but a rotor sandwiched between two stators is also possible. The stator 70 has two concentric electrodes 71 and 72 of equal surface area, one of which is driven by the direct output of an exciter 81 (FIG. 8), and the other of which is driven with a complementary signal. The drive signal is typically a square wave of a few kilohertz. The rotor disc 73 has two ring-shaped electrodes 74 and 75 facing the stator electrodes 71 and 72, and capacitively picking up the signals which they carry. The rotor further carries a plurality of circumferentially offset segments 76 and 77 which are each electrically connected either to the outer ring electrode 74 or to the inner ring electrode 75. These segments thus each carry an essentially square-wave signal either in phase or out of phase with regard to the exciter 81.

The stator 70 further features five segments 90 to 94 that are two increments wide and are spaced at equal intervals around the circumference in the same band and opposing the code pattern on the disc. These segments capacitively pick up the signal from either the in-phase or the out-of-phase excitation signal. Where two adjacent rotor fields of opposite phase both face a pickup electrode, the coupled signals cancel, thereby yielding the third or "zero" state.

Figure 8:
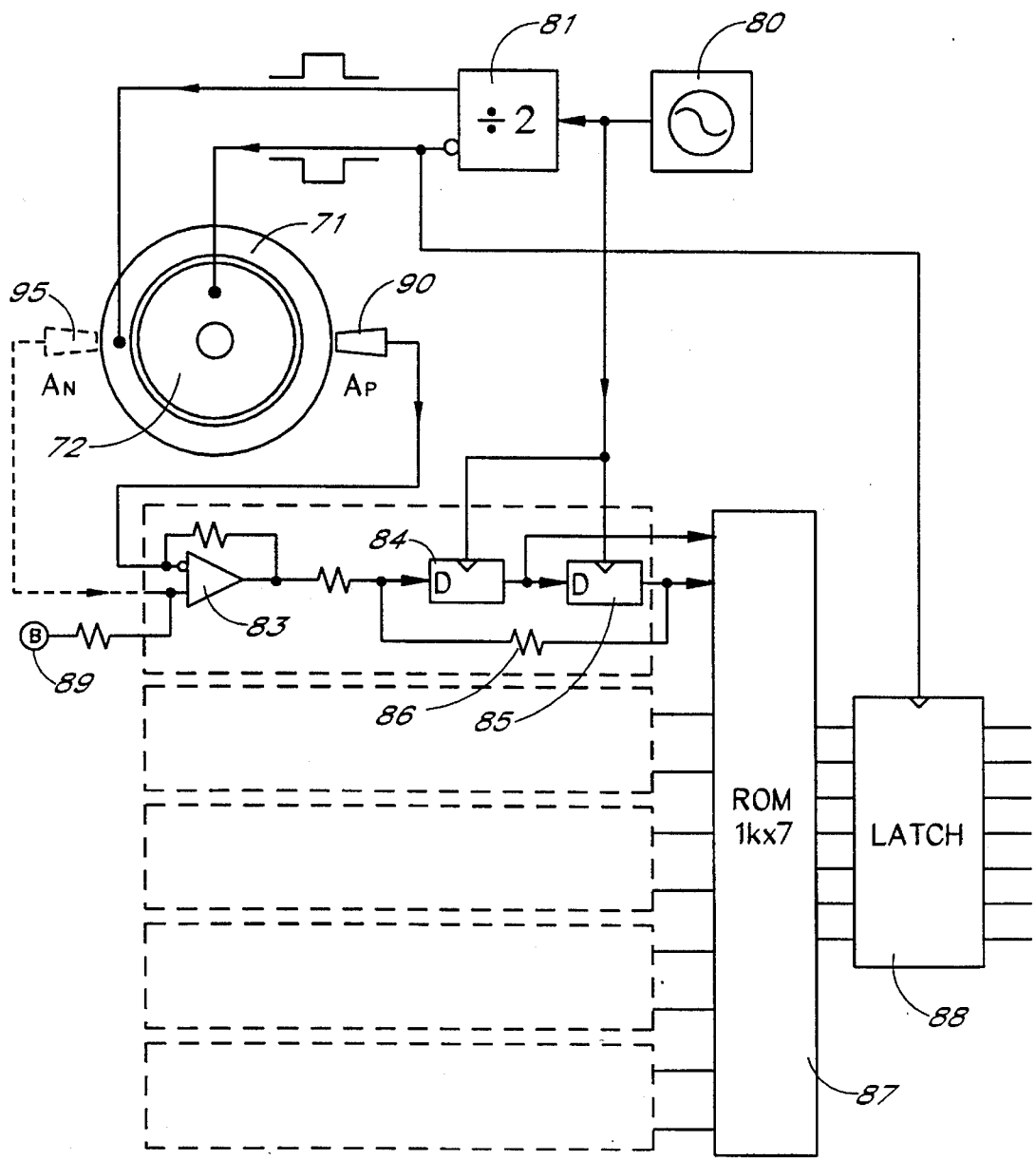
FIG. 8 is a diagrammatic view of the electronic excitation circuitry, amplification circuitry, and synchronous detection circuitry utilized to distinguish the three levels in a capacitive encoding scheme.

FIG. 8 shows the circuitry connected to the capacitive encoder. An oscillator 80 followed by a frequency dividing exciter 81 generates the two phase signals connected to the concentric electrodes 71 and 72 of stator 70. Since the detection circuitry is identical for each of the five channels, only one is shown. In particular, a high-impedance operational amplifier 83 amplifies the signal from the electrode 90. Typically this is a low power, slew rate limited device, which shapes the original square wave signal into a rounded triangular wave. Two cascaded D-type flip-flops 84 and 85 act as synchronous detectors, the output of the amplifier 83 being connected through a resistor to the data input of flip flop 84, and the data output of flip flop 84 being connected to the data input of flip flop 85.

The input amplifier 83 is biased to a set point 89 so as to have the positive peaks of the amplified electrode output signal be clearly above the threshold input level of the flip-flop 84, which is typically 50% of the supply voltage. A slight amount of positive feedback 86 has been added to provide Schmitt trigger action for clean transitions between states. The outputs of the detector circuits for the respective channels are connected to address inputs of a 1 k×7 ROM 87, which converts the 5 input line pairs to a 7 bit binary output code that is sampled by a latch 88. The ROM 87 is functionally equivalent to the ROM 40 of FIG. 4.

The flip flops are clocked simultaneously by the oscillator 80 in a way so as to sample either the positive or the negative peak of the amplified electrode signal. The binary output of the ROM 87 is latched into the latch 88 once per period of the square wave applied to the electrodes. At this instant an amplified input electrode signal which is in phase with the master oscillator will have set the first flip flop 84, whereas a signal out of phase will have set the second flip flop 85. In the "zero" case, the amplified electrode signal is too small to set either. The flip flops 84 and 85 are clocked twice as fast as the latch 88. Thus, after the latch is loaded, the flip flop 84 is loaded, and then its contents are transferred to the flip flop 85 as the flip flop 84 is loaded again, after which the latch is loaded again. If the disk is not being rotated, the flip flops 84 and 85 will both contain the same logic value when the latch is loaded. On the other hand, if the disk is being rotated, the flip flops may contain the same value or may contain different values when the latch is loaded.

In certain cases the code pattern can be symmetrical. For example, the second fifty steps of the above one hundred step pattern have the exact opposite polarity as compared to the first fifty (see also FIG. 2c). Such a code allows the use of differential detectors placed 180° out of phase. The dashed segments 95 to 99 in FIG. 7 and the dashed input lines in FIG. 8 illustrate the differential configuration. In a high impedance capacitive set-up, a differential scheme has the advantage of substantially increased noise immunity.

A ternary coding scheme reduces the number of required sensors, and is particularly appropriate for values that naturally feature three states, such as the contacting, magnetic and capacitive examples given above. Under certain circumstances it is, however, more advantageous to utilize a binary code:

a) When three levels are hard to define in real life conditions. The output amplitude of an LED/phototransistor pair is subject to major variation, and establishing a 50% value requires extra adjustment.

b) When the encoder is directly interfaced to an off-the-shelf electronic component (ROM or driver). Since standard digital circuitry operates on binary logic, choosing a binary coding scheme makes sense in such cases.

The binary code must again feature only a one bit change per transition, just like set forth for the ternary code and illustrated in FIG. 2b.

Figure 9:
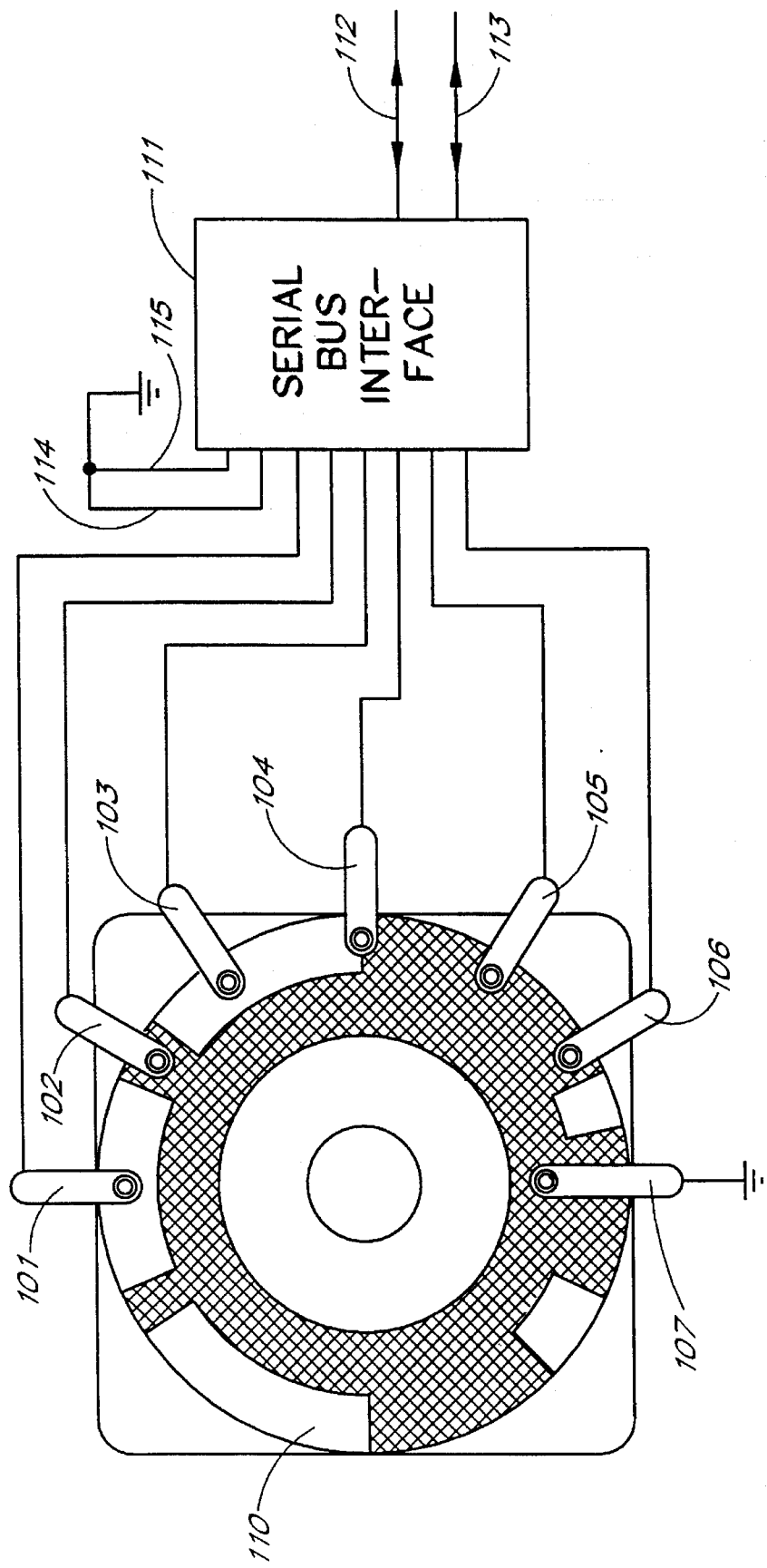
FIG. 9 is a diagrammatic view of still another embodiment of the invention, which is based on a binary coding scheme featuring 60 unique positional readings and a contacting detection arrangement.

FIG. 9 illustrates a case where an 8-bit bus driver integrated circuit is used to provide a serial output from the encoder, thus utilizing a two wire interface. Such a bus interface can be implemented with a commercially available part (for example a PCF 8574 made by Philips of Eindhoven, the Netherlands). Six pickup contacts 101 through 106 are arranged at angular spacings of 30° about a coding wheel 110, which has conductive and nonconductive regions on its surface. A seventh contact 107 provides a ground reference to the coding wheel 110. The coding wheel 110 is patterned for sixty positions in a manner similar to the previous examples, except that now we distinguish only two states. These are "grounded" or "open". An open contact will result in a high level signal due to the internal pull-up resistors of the interface circuit 111. An encoder built in this fashion can be tied to a serial bus, where a number of devices can be connected to the same two wire line (112 is the serial data, and 113 the serial clock). The two highest bits 114, 115 of the interface circuit are grounded.

Extending the number of contacts, binary encoders with higher resolutions are possible. With eight sliding contacts, the maximum number of positions that can be resolved is 240, as long as one wants to maintain the previously established requirement that only one state must change at a time.

Figure 10:
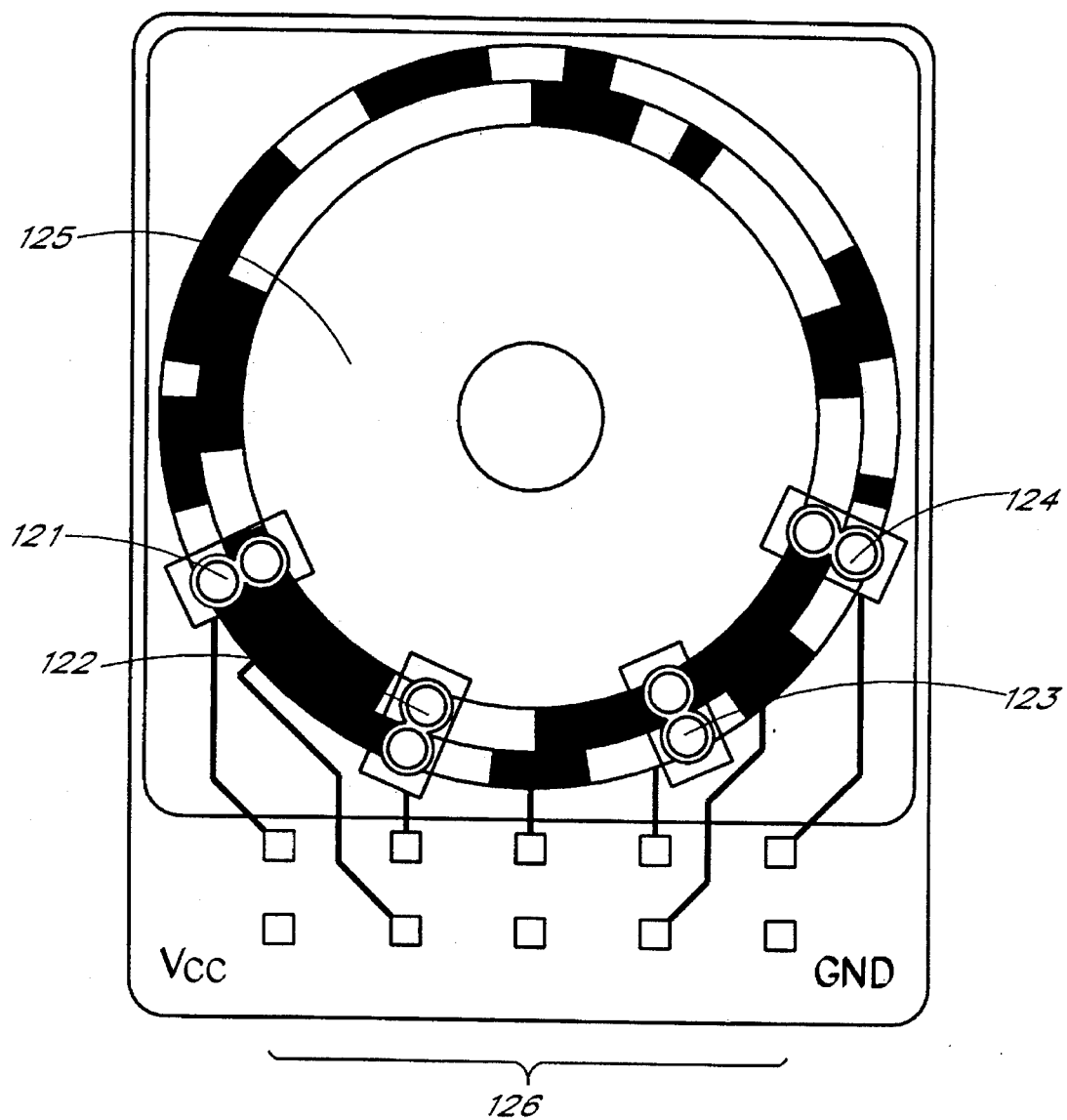
FIG. 10 is a diagrammatic view of still another embodiment of the invention, based on a quaternary coding scheme featuring 256 unique positional readings and optical detection arrangement.

Since many industrial controllers operate on an 8-bit basis, providing an encoder with a 256-position resolution is desirable. The arrangement shown in FIG. 10 illustrates such a device. The wheel 125 is transparent, except for opaque portions defining the code. Four pairs of phototransistors 121 through 124 are arranged along the circular track. Each pair is illuminated by a respective conventional and not-illustrated LED on the opposite side of the wheel. The code inscribed on the wheel 125 is a quaternary (four level) code. Each detector pair acts as a quaternary (four-level) sensor which senses the following states: 0, 1, 3, 2 (binary 00, 01, 11, 10). The numbers are purposely listed in this sequence since, as in the ternary example, only certain transitions are legal. In the above list each number can connect only to its neighbor, and 0 connects to 2 and vice versa. This is essentially a Gray-code feature, which ensures glitchless transitions between states.

Adhering to this rule, a sequence with 256 positions can be realized, thus exploiting the highest resolution for an 8-bit system. The encoder is shown here with a parallel interface 126.

For the sake of illustration, the encoders shown here are all of moderate resolution. The described principle can be applied to devices with much finer resolution. The limits of resolution are governed by the same physical constraints as apply to conventional, parallel encoders.

Note that if power to any of the inventive encoders is turned off and then back on, the encoder will output accurate absolute position information based solely on the set of currently-sensed code values, without any need to move the encoder parts relative to each other. Stated differently, all of the encoders that have been described herein are "absolute" encoders.

Although several preferred embodiments have been shown and described in detail for illustrative purposes, it will be recognized that there are variations and modifications of these preferred embodiments, including the rearrangement of parts, which lie within the scope of the present invention.

The embodiments of the invention in which an exclusive property or privilege is claimed are defined as follows:

1. A method of generating a numerical value representing an absolute position of a first member with respect to a second member where said first and second members are supported for relative movement, comprising the steps of:

providing on said first member an elongate track having a code extending therealong;

sensing said code with a plurality of sensors at a plurality of respective locations on said second member, said sensors adjacent said track at spaced locations therealong, said track moving past each said sensor during relative movement of said first and second members; and for each of N different relative positions of said first and second members, generating a set of digital values, each digital value of said set corresponding to a respective sensor of said plurality of sensors, a code word formed by said set of digital values being unique for each of said N relative positions, wherein N is greater than four times the number of sensors in said plurality of sensors.

2. A method according to claim 1, wherein each said digital value represents one of a predetermined number of different states, said predetermined number being greater than or equal to three.

3. A method according to claim 1, wherein said digital values are each a respective ternary digit.

4. A method according to claim 1, including the steps of defining said code as a plurality of information portions and dividing said track into a plurality of sections each having a common predetermined length and each containing a respective one of said information portions, and wherein said sensing step is carried out by sensing at each of said locations a portion of said track having a length which is substantially twice said predetermined length.

5. A method according to claim 4, including the steps of using for each said information portion one of two digital states, each of said digital values being a ternary value, and said set of digital values representing a multi-digit ternary code word.

6. A method according to claim 1, including the step of defining said code on said track to have successive first and second halves, said second half being the complement of said first half.

7. A method according to claim 1, wherein said sensors are disposed on said second member at equally spaced locations along said track.

8. A method according to claim 1, including the step of using for each said digital value a binary value.

9. A method according to claim 1, including the step of causing the code word to change in value each time said first member is moved a predetermined amount with respect to said second member, only one of said digital values of said set changing each time said first member is moved said predetermined amount relative to said second member.

10. The method according to claim 1, wherein only one of said digital values of said code word changes at-a-time when said first and second members are moved relative to one another.

11. The method according to claim 1, further comprising the step of converting said set of digital values into a final binary output representative of an absolute position of said first member with respect to said second member.

12. The method according to claim 11, wherein said step of converting comprises accessing a look-up table stored in a memory.

13. The method according to claim 11, wherein said step of converting is performed such that said final binary output progressively increases or decreases in value as said first member is progressively moved relative to said second member through said N positions.

14. The method according to claim 1, wherein said track is circular.

15. An apparatus, comprising:

a first member having thereon an elongate track with a code extending therealong; and a second member supported for movement relative to said first member and having thereon a plurality of sensors which are each adjacent said track at spaced locations therealong and which are each configured to sense said code, said sensors each moving along said track in response to relative movement of said first and second members, each of said sensors generating a respective digit of a multi-digit code word representative of an absolute position of said first member relative to said second member, said multi-digit code word having N possible values wherein N is greater than four times the number of said sensors, each of said N values uniquely corresponding to a respective relative position of said first and second members.

16. An apparatus according to claim 15, wherein each said digit represents one of a predetermined number of different states, said predetermined number being greater than or equal to three.

17. An apparatus according to claim 15, wherein each said digit is a ternary digit.

18. An apparatus according to claim 15, wherein said second member is a stationary plate and said first member is a disk which rotates relative to said plate, said first and second members being supported in a common housing to form a compact shaft encoder.

19. An apparatus according to claim 15, wherein said second member is a stationary plate and said first member is a linear scale moveable relative to said plate, said first and second members forming a compact linear encoder.

20. An apparatus according to claim 15, wherein said sensors on said second member include contacts which mechanically engage said track on said first member.

21. An apparatus according to claim 15, wherein said sensors on said second member are magnetic sensors, and said code is stored magnetically along said track.

22. An apparatus according to claim 15, wherein said sensors on said second member optically sense said code on said first member.

23. An apparatus according to claim 15, wherein said sensors on said second member capacitively sense said code on said first member.

24. An apparatus according to claim 15, wherein said first member is moved manually with respect to said second member.

25. An apparatus according to claim 15, wherein said code and said sensors are configured such that only one of said digits can change at-a-time when said first and second members are moved relative to one another.

26. An apparatus according to claim 25, further comprising a circuit for converting said multi-digit code word into a binary word such that successive relative positions of said first and second members produce successive binary values of said binary word.

27. An apparatus according to claim 15, wherein each of said sensors senses one of two possible states, and wherein each of said digits of said multi-digit code word is a binary digit.

28. An apparatus according to claim 15, wherein said track is generally circular.

29. A method of generating a multi-digit number representing an absolute position of a first member with respect to a second member where said first and second members are supported for relative movement, comprising the steps of:

providing on said first member an elongate code track comprised of a plurality of information elements of a code, each of said information elements occupying a respective segment of said track, said segments corresponding to a detectable absolute relative positions of said first and second members;

sensing said code at a plurality of locations on said second member which are adjacent said track at spaced locations therealong, said track moving past each said location during relative movement of said first and second members; and for each of said locations, generating a respective digit of said multi-digit number, each said digit having one of a predetermined number of states, said predetermined number being greater than or equal to three, said step of generating responsive to said step of sensing.

30. A method according to claim 29, wherein said predetermined number is three, and wherein each said information element of said code has one of three different states.

31. A method according to claim 29, wherein said predetermined number is four.

32. A method according to claim 29, wherein only one of said digits of said multi-digit value changes at-a-time when said first and second members are moved relative to one another.

33. A method according to claim 29, wherein said locations are uniformly spaced along said track.

34. An absolute Gray coded position encoder, comprising:

a first member having a plurality of sensor-detectable elements thereon, said sensor-detectable elements positioned along a common track; and a second member movably mounted with respect to said first member to define N discrete relative positions of said first and second members, said second member having a set of sensors thereon for detecting said sensor-detectable elements, said sensors spaced apart from one another and positioned in alignment with said track such that said sensor-detectable elements pass adjacent to said sensors, each sensor of said set having an output that corresponds to a respective digit of a code word generated by said encoder, adjacent values of said code word differing in exactly one digit;

said sensor-detectable elements and said sensors positioned relative to one another so that the value of said code word is unique for each of said N positions, where N is greater than four times the number of sensors in said set.

35. The absolute position encoder according to claim 34, wherein each of said digits of said code word is a binary digit having two possible states.

36. The absolute position encoder according to claim 34, wherein each of said digits of said code word is a ternary digit having three possible states.

37. The absolute position encoder according to claim 34, wherein each of said digits of said code word is a quaternary digit having four possible states.

38. The absolute position encoder according to claim 34, wherein said sensors are spaced apart at substantially equal intervals along said track.

39. The absolute position encoder according to claim 34, wherein said track is generally circular.

40. A 60-position binary absolute position encoder, comprising:

a first member having a plurality of sensor-detectable elements thereon, said sensor-detectable elements positioned along a common track; and a second member movably mounted with respect to said first member to define 60 discrete relative positions of said first and second members, said second member having six binary sensors thereon for detecting said sensor-detectable elements, said binary sensors spaced apart from one another and positioned in alignment with said track such that said sensor-detectable elements pass adjacent to said binary sensors, each of said binary sensors having a respective binary output that corresponds to a respective bit of a six-bit code word generated by said encoder, the value of said code word being unique tier each of said 60 relative positions.

41. The 60-position binary absolute position encoder according to claim 40, wherein said sensor-detectable elements and said binary sensors are positioned such that only one bit of said six-bit code word changes at-a-time during relative movement of said first and second members.

42. A ternary absolute Gray coded position encoder, comprising:

a first member having a plurality of sensor-detectable elements thereon, said sensor-detectable elements positioned along a common track; and a second member movably mounted with respect to said first member, said second member having a set of sensors thereon for detecting said sensor-detectable elements, said sensors spaced apart from one another and positioned in alignment with said track such that said sensor-detectable elements pass adjacent to said sensors, each sensor of said set having a respective ternary output that corresponds to a respective ternary digit of a code word generated by said encoder;

wherein said sensor-detectable elements and said sensors are arranged such that individual values of said code word correspond uniquely to respective relative positions of said first and second members, and such that only one of said ternary digits of said code word can change at-a-time during relative movement of said first and second members.

43. The encoder according to claim 42, wherein each of said ternary digits comprises two bits, and wherein said sensor-detectable elements and said sensors are further arranged such that only one bit of each ternary digit can change at-a-time during relative movement of said first and second members.

44. The encoder according to claim 42, wherein said track is circular.

45. The encoder according to claim 42, wherein the number of sensors in said set is three, and wherein said code word has 24 possible values which correspond respectively to 24 detectable relative positions of said first and second members.

46. The encoder according to claim 42, wherein the number of sensors in said set is four, and wherein said code word has 64 possible values which correspond respectively to 64 detectable relative positions of said first and second members.

47. The encoder according to claim 42, wherein the number of sensors in said set is five, and wherein said code word has 100 detectable positions which correspond respectively to 64 detectable relative positions of said first and second members.

* * * * *

UNITED STATES PATENT AND TRADEMARK OFFICE
CERTIFICATE OF CORRECTION

PATENT NO. : 5,519,393
DATED : May 21, 1996
INVENTOR(S) : Marco Brandestini

It is certified that error appears in the above-indentified patent and that said Letters Patent is hereby corrected as shown below:

Title page, item [73], Assignee: should read-- Bourns, Inc.--.

Column 12, line 12, after "unique" and before "each, " change "tier"to -- for --.

Signed and Sealed this

Nineteenth Day of November, 1996

Attest:

BRUCE LEHMAN

*Attesting Officer*  *Commissioner of Patents and Trademarks*